(12) United States Patent
Mandelman et al.

(10) Patent No.: US 6,288,422 B1
(45) Date of Patent: Sep. 11, 2001

(54) STRUCTURE AND PROCESS FOR FABRICATING A 6F² DRAM CELL HAVING VERTICAL MOSFET AND LARGE TRENCH CAPACITANCE

(75) Inventors: Jack A. Mandelman, Stormville; Rama Divakaruni, Somers; Carl Radens, LaGrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/540,276

(22) Filed: Mar. 31, 2000

(51) Int. Cl.⁷ .................. H01L 27/108; H01L 29/76; H01L 29/94; H01L 31/119
(52) U.S. Cl. ............................... 257/301; 257/302
(58) Field of Search ..................... 257/295–310; 438/240–253, 396–398

(56) References Cited

U.S. PATENT DOCUMENTS

| | | | |
|---|---|---|---|
| 4,830,978 | * 5/1989 | Teng et al. | 438/243 |
| 4,833,516 | 5/1989 | Hwang et al. . | |
| 4,984,039 | 1/1991 | Douglas . | |
| 5,034,781 | * 7/1991 | Dhong et al. | 257/302 |
| 5,177,576 | 1/1993 | Kimura et al. . | |
| 5,252,845 | 10/1993 | Kim et al. . | |
| 5,519,236 | 5/1996 | Ozaki . | |
| 5,529,944 | * 6/1996 | Rajeevakumar | 438/243 |
| 5,937,296 | 8/1999 | Arnold . | |
| 5,977,579 | 11/1999 | Noble . | |
| 6,074,909 | * 6/2000 | Gruening | 438/242 |
| 6,094,614 | * 7/2000 | Gruening et al. | 438/391 |

* cited by examiner

Primary Examiner—Steven Loke
Assistant Examiner—Cuong Q Nguyen
(74) Attorney, Agent, or Firm—Scully, Scott, Murphy & Presser; Steven Capella, Esq.

(57) ABSTRACT

A 6F² memory cell structure comprising a plurality of capacitors each located in a separate trench in a substrate; a pluralaity of transfer transistors each having a vertical gate dielectric, a gate conductor, and a bitline diffusion, each transistor being located above and electrically connected to a respective trench capacitor; a plurality of troughs in a striped pattern about said transistor, said troughs being spaced apart by a substantially uniform spacing, said plurality of striped troughs comprising a first group of troughs consisting of every other one of said troughs being filled with a dielectric material, and a second group of troughs being the remaining troughs of said plurality, said second group of troughs containing dielectric material, damascened wordlines and damascene wordline contacts; a respective wordline electrical contact connected to each respective gate conductor; and a bitline contacted to each bitline diffusion, wherein said bitline diffusions have a width defined by said spacing of said striped troughs and each wordline electrical contact is self-aligned to an edge of a trough of said second group of troughs.

19 Claims, 18 Drawing Sheets

X1-X1

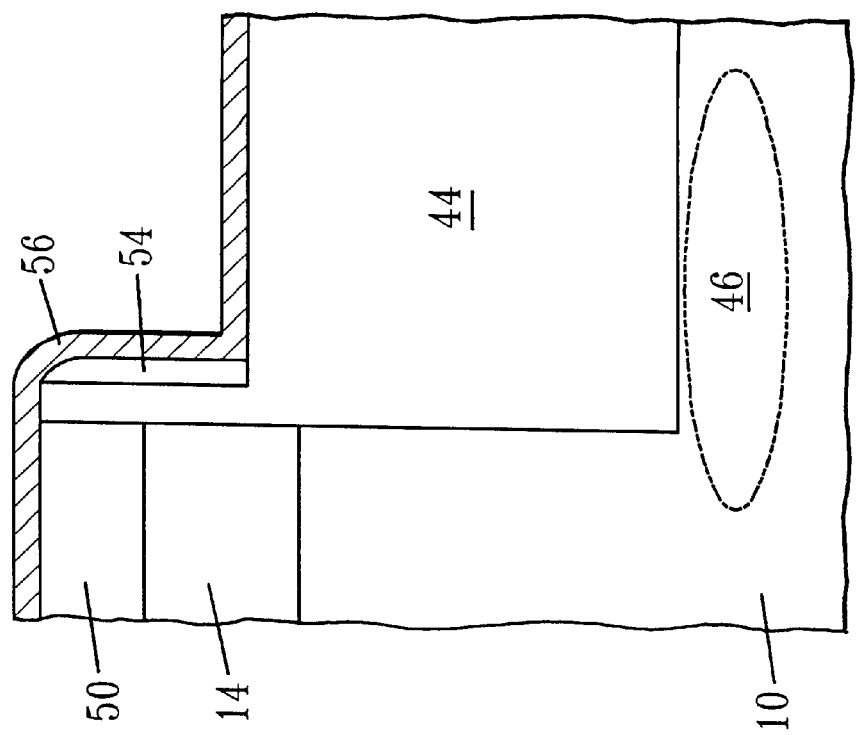
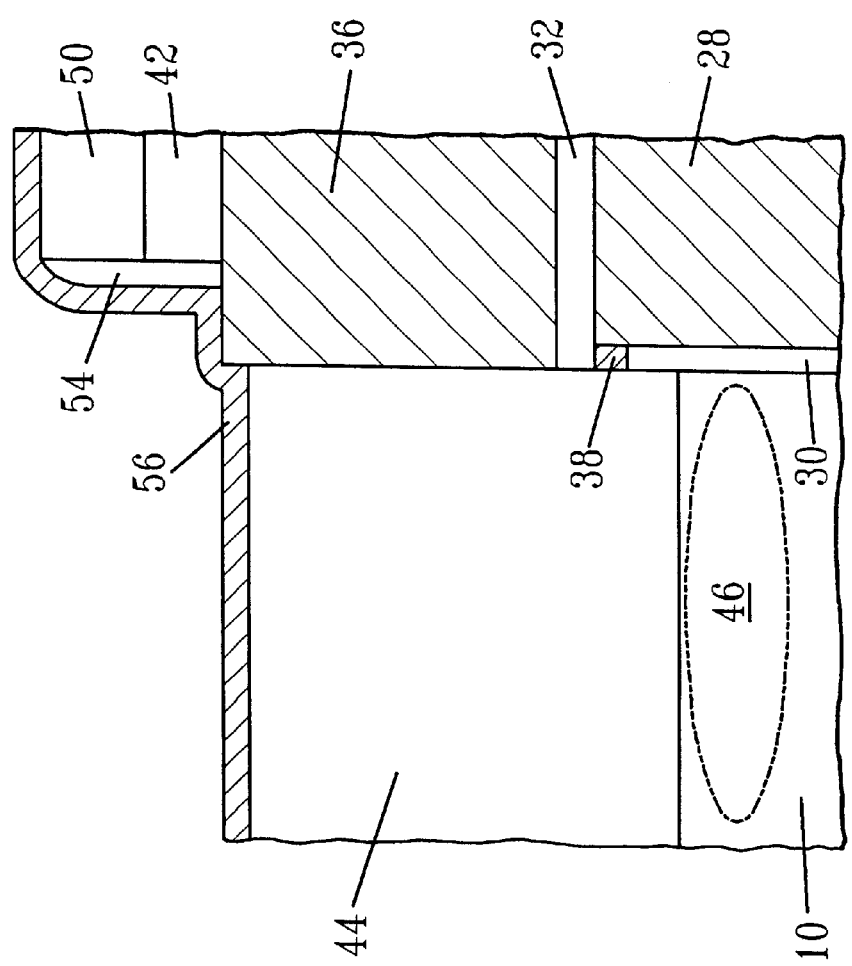

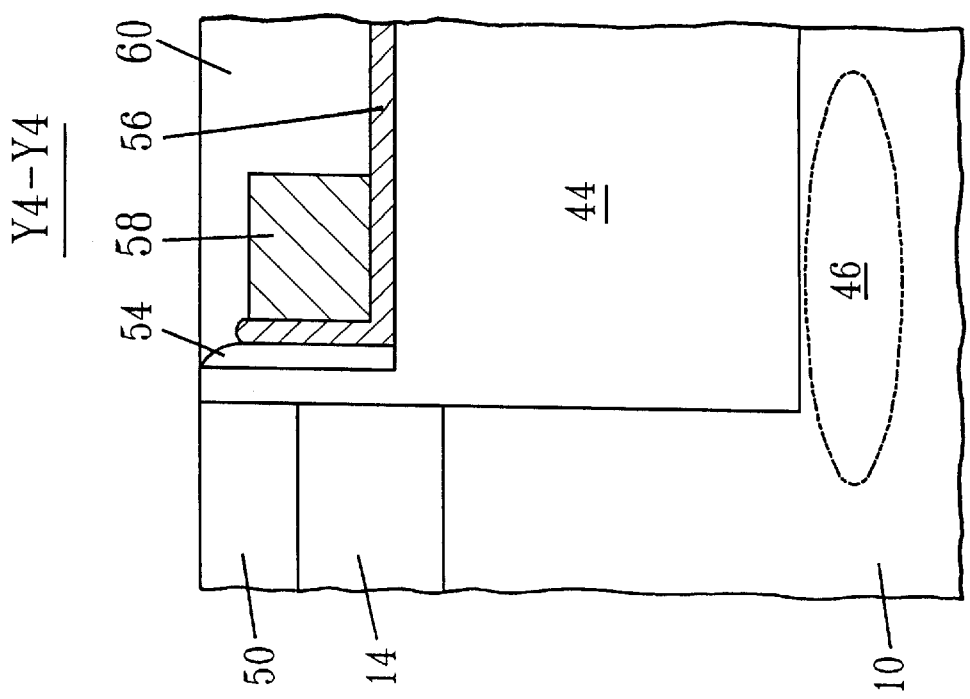
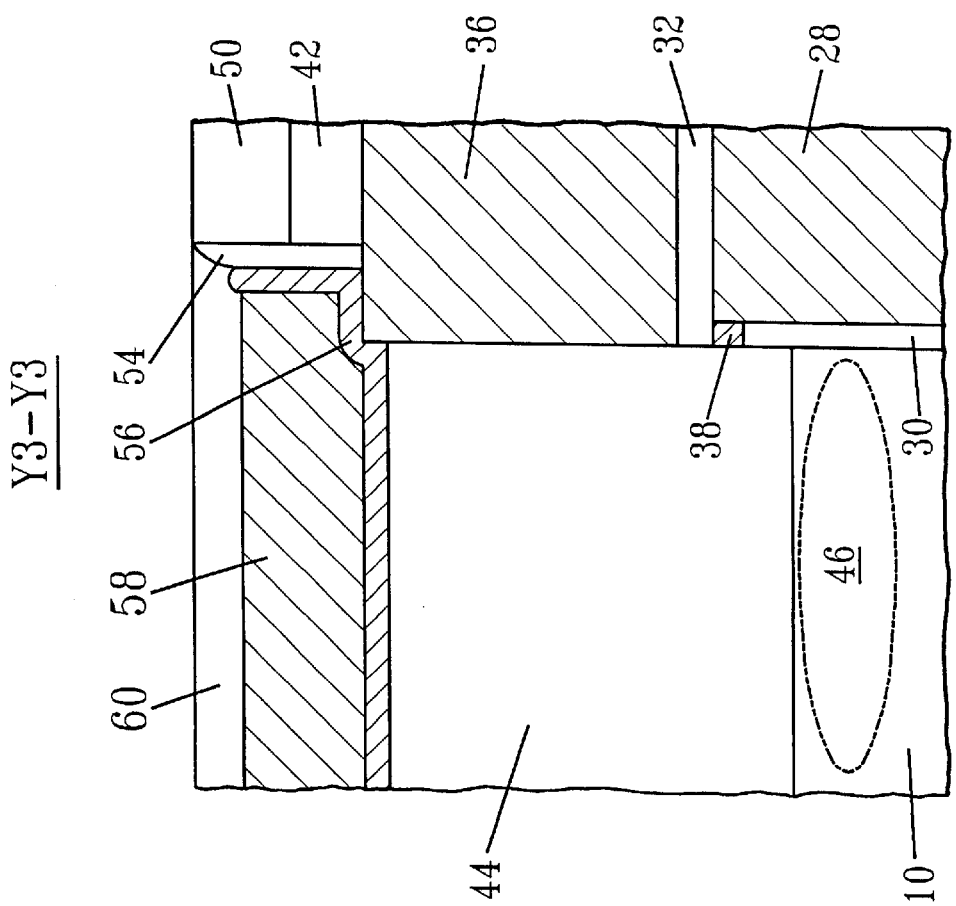

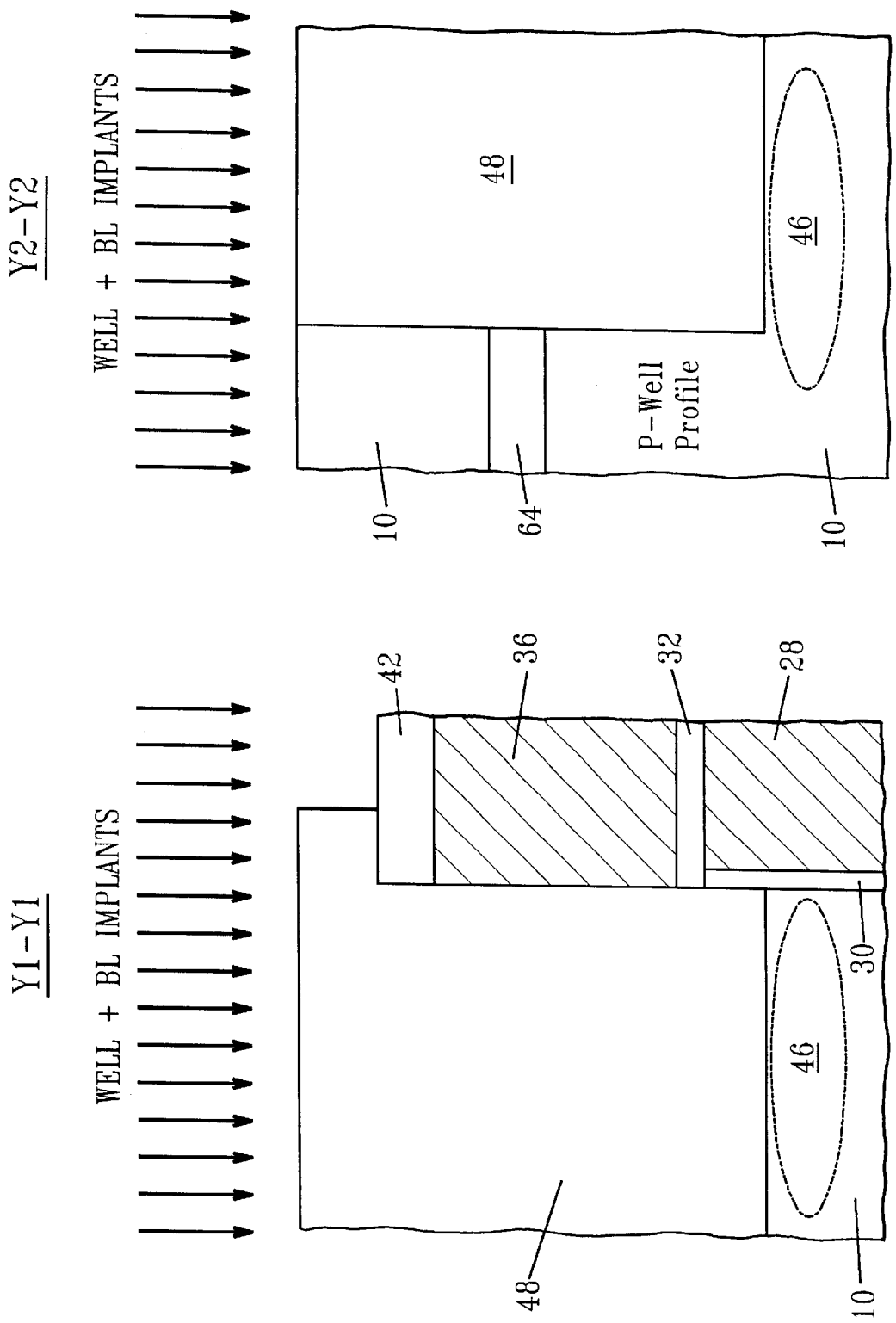

STRUCTURE AND PROCESS FOR FABRICATING A 6F² DRAM CELL HAVING VERTICAL MOSFET AND LARGE TRENCH CAPACITANCE

FIELD OF THE INVENTION

The present invention relates to dense memory cells, and more particular to $6F^2$ memory cells which are scalable to a minimum feature size of 100 nm or below. The present invention is also directed to a process of fabricating such a memory cell which avoids lithographically difficult features.

BACKGROUND OF THE INVENTION

Present trends in dynamic random access memory (DRAM) technology are constantly driven towards reduction in minimum feature size, F, and more compact cell layouts, i.e., denser than $8F^2$. As a result of the need for ever increasing array densities, the scalability of contemporary planar metal oxide semiconductor field effect transistor (MOSFET) cells for F=150 nm and smaller dimensions is facing fundamental concerns. The main concern with the scalability of the MOSFET cell is the increased P-well doping concentration needed to meet off-current objectives. It is well known in the art that increased array well doping concentration may result in a marked increase in array junction leakage, which degrades retention time. The problem of scalability related to the MOSFET cell, by itself, is driving the paradigm shift towards vertical MOSFET access transistors in the array.

A great depth of knowledge of, and experience with, deep trench (DT) storage capacitor technology exists. However, with increasingly smaller groundrules and denser cell layouts, the ability to obtain adequate DT storage capacitance (on the order of about 35fF) is being seriously challenged. The difficulty in obtaining adequate DT storage capacitance is due to several factors including: (1) limitations on the scalability of the thickness of the node dielectric; (2) limitations on the etch depth of the DT; and (3) reduction of capacitance area that occurs with groundrule reduction, e.g., scaling, and more dense cell layouts, i.e., $6F^2$ and $7F^2$ vs. $8F^2$. Reactive-ion etching (RIE) lag effect caused by smaller storage trench openings makes etching adequate deep trenches difficult. Filling of these extremely high aspect ratio (>50:1) trenches also presents major difficulties.

Furthermore, the high aspect ratios associated with aggressively scaled DT capacitors result in increased series resistance which, in turn, results in decreased signal development within a given time window. For a $6F^2$ cell with a near 1×1 DT opening, it is expected that the above mentioned problems of capacitance and resistance may become a major problem by the 120 nm generation. For DRAM producers with firmly established DT capacitor technology as the main stream storage element for longer than the past decade, it would be costly to switch to an alternative storage technology such as stacked capacitors with a high dielectric constant.

Thus, there is a need for DRAM cells containing vertical access transistors, dense layouts (denser than about $8F^2$) and trench storage capacitors which yield sufficient capacitance and reduced series resistance to avoid degraded signal development.

Although some existing DRAM cells employing vertical MOSFETs offer very significant scalability advantages over conventional planar designs practiced today, there is still a great deal of room for improvement. For example, for cells using vertical MOSFETs and trench storage capacitors, a single bitline contact is commonly used to access a pair of bits; the pair of bits share a common silicon active area (AA). In this type of cell, dynamic coupling between the two back-to-back vertical MOSFETs results in charge pumping effects and loss of signal. Modeling has shown that electrons pumped into the P-well from a collapsing channel inversion layer of one cell may be collected by the storage node of the adjacent cell sharing the same AA. These coupling effects are accentuated as dimensions are scaled down. Modeling projections indicate that scalability to 100 nm and below may be problematic because of dynamic charge loss due to coupling between adjacent cells.

In addition to charge pumping problems, very dense prior art designs suffer from threshold voltage variations in the size of the silicon AA which occurs with overlay (alignment) errors between various masking levels and with dimensional variations of features formed by these masking levels.

Another problem faced with aggressively scaled DRAM cells is the increased aspect ratio (height to width) of the isolation regions. This is especially a concern with vertical MOSFETs in the array because of the requirement that the isolation trench be deep enough to cut the strap so as to prevent cell-to-cell leakage between straps. Typically, it is required that the isolation trench be at least 500 nm in depth to isolate the straps of the vertical MOSFETs. If the thickness of the pad layer is included, an isolation trench aspect ratio of 7:1 is anticipated by the 100 nm generation.

Prior art memory cell layouts also suffer from the bitline pitch limiting the density of the array. Moreover, in prior art memory cells, a truly planar structure is difficult to obtain; therefore prior art memory cells have decreased depth of focus for the bitline and higher wiring levels.

In view of the drawbacks mentioned hereinabove with prior art DRAM cell designs, there is a continued need to develop new and improved DRAM cell designs that are denser than prior art designs and have a larger DT size. A larger DT size is advantageous in dense DRAM cells since it provides a large storage capacitance and reduced series resistance to the array cell.

SUMMARY OF THE INVENTION

An object of the present invention is to provide a dense memory cell ($6F^2$) which is scalable to a minimum feature size of 100 nm or less.

Another object of the present invention is to provide a dense memory cell layout which is facilitated by a bitline pitch which is smaller than 2F.

A still further object of the present invention is to provide a dense memory cell in which the dynamic leakage due to adjacent cell activity has been substantially eliminated.

A yet further object of the present invention is to provide a dense memory cell that is fully self-aligned so as to substantially eliminate sensitivity of AA size to all overlay variations.

An even further object of the present invention is to provide a dense memory cell having the following characteristics:

A novel isolation structure provided by adjacency of trench isolation regions and damascene wordlines which are integrated with an insulator.

Improved planarity and depth of focus for printing higher wiring levels.

A large DT (2×1) size for storage capacitance, reduced ohmic resistance and ease of fabrication.

An array trench isolation pattern (stripes 2F wide) which has reduced aspect ratio for simplified filling.

These and other objects and advantages are obtained in the present invention by utilizing a 2F deep trench, 2F trench isolation stripes to define active area, a vertical MOSFET, and damascene wordlines.

One aspect of the present invention is directed to a $6F^2$ memory cell structure comprising:

a plurality of capacitors each located in a separate trench in a substrate;

a plurality of transfer transistors each having a vertical gate dielectric, a gate conductor, and a bitline diffusion, each transistor being located above and electrically connected to a respective trench capacitor;

a plurality of troughs in a striped pattern about said transistors, said troughs being spaced apart by a substantially uniform spacing, said plurality of striped troughs comprising a first group of troughs consisting of every other one of said troughs being filled with a dielectric material, and a second group of troughs being the remaining troughs of said plurality, said second group of troughs containing dielectric material, damascened wordlines and damascene wordline contacts;

a respective wordline electrical contact connected to each respective gate conductor; and a bitline contacted to each bitline diffusion, wherein said bitline diffusions have a width defined by said spacing of said striped troughs and each wordline electrical contact is self-aligned to an edge of a trough of said second group of troughs.

Another aspect of the present invention relates to a method of fabricating the aforementioned $6F^2$ memory cell. Specifically, the method of the present invention comprises the following processing steps:

(a) providing a semiconductor substrate having a storage trench with a capacitor formed in said storage trench, said capacitor being vertically recessed from an entrance of said storage trench, said substrate having a pad dielectric material layer about an uppermost portion of said storage trench, said trench capacitor having a trench electrode and a strap electrode material electrically contacting said trench electrode and a portion of said substrate about the top of said trench capacitor, said trench capacitor also including a dielectric collar material about an upper portion of said trench electrode, said collar material contacting said strap;

(b) forming a capacitor-topping dielectric layer over said strap and trench electrode material, said dielectric layer extending across an entire cross section of said storage trench, whereby a space in said storage trench above said topping dielectric layer is defined;

(c) forming a gate dielectric layer on at least a portion of a wall surface of said storage trench above said topping dielectric layer;

(d) filling said space above said topping dielectric layer with a gate conductor material;

(e) forming a patterned photoresist layer above a portion of said gate conductor while leaving another portion of said gate conductor exposed;

(f) removing said exposed portion of said gate conductor so as to expose a portion of said topping dielectric layer;

(g) removing said exposed portion of said topping dielectric layer so as to expose a portion of said strap and said trench electrode;

(h) removing said exposed portion of said strap, a portion of said exposed trench electrode and a portion of said gate conductor, said portion of gate conductor being removed from an uppermost portion of said storage trench, thereby exposing a portion of said collar dielectric material;

(i) filling space in said storage trench provided by steps (f)–(h) with a dielectric material that is different from said pad dielectric layer;

(j) depositing a second nitride layer on said structure;

(k) forming a first striped photoresist mask over said substrate, said stripes running in a direction substantially orthogonal to a principal width of said storage trench, said mask defining spaces on said substrate overlapping both ends of said storage trench;

(l) removing material from said substrate at said space selective to said filling dielectric material to form stripe troughs extending into said substrate to a depth below an upper edge of said collar dielectric material;

(m) removing said first photoresist stripe mask;

(n) filling said stripe troughs of step (l) with a dielectric material different from said pad dielectric layer so as to form isolation trenches;

(o) planarizing said trench dielectric material to expose said pad dielectric material;

(p) forming a second striped photoresist mask over said substrate, said stripe defining openings substantially parallel to said isolation trenches, and said openings defining a wordline location and an isolation location, wherein one of said locations overlaps the filled stripe troughs on a second end of said storage trench;

(q) removing said trench dielectric material at said wordline location spaces to a level to cause exposure of said gate conductor;

(r) forming a conductor on said exposed gate conductor provided in step (q) so as to form a wordline and forming a further dielectric material over said wordline;

(s) removing said pad dielectric material in a space bounded by said wordline and said isolation trench to expose a portion of said substrate; and (t) implanting a bitline diffusion into said exposed substrate.

BRIEF DESCRIPTION OF THE DRAWINGS

FIGS. 1–17 depict a $6F^2$ memory cell design having large DT capacitor storage elements and vertical MOSFETs through various processing steps of the present invention.

DETAILED DESCRIPTION OF THE INVENTION

Figure 1:
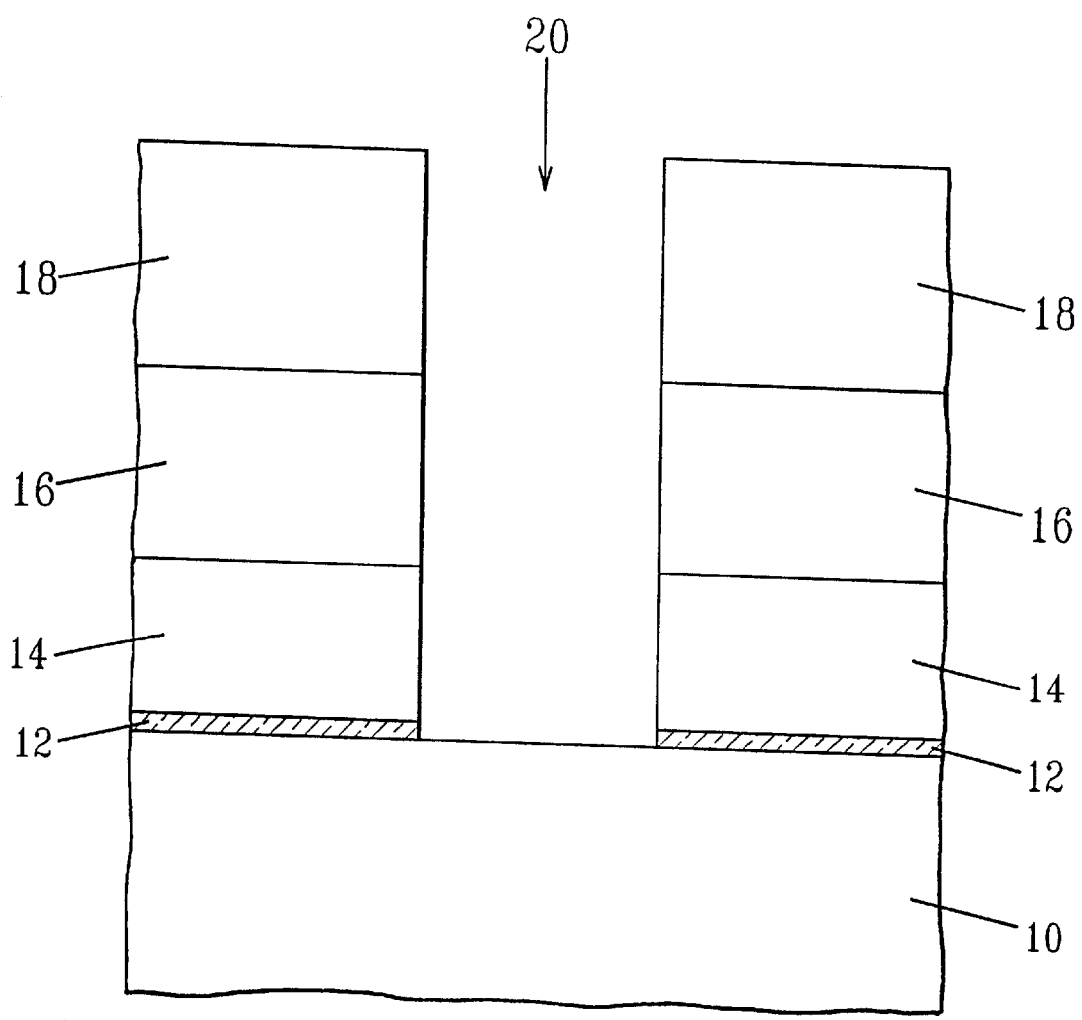

The present invention which provides a $6F^2$ memory cell having the above mentioned features and a process of fabricating the same will now be described in more detail by referring to the drawings that accompany the present application. It is noted that in the accompanying drawings like reference numerals are used for describing like and corresponding elements. It is also noted that although some of the drawings of the present application depict the presence of only one element, a plurality of elements may be present.

FIG. 1 is a cross-sectional view of an initial structure that can be used in the present invention in forming a deep trench capacitor. Specifically, FIG. 1 comprises a semiconductor substrate 10 that has a pad oxide layer 12, e.g., $SiO_2$, that is formed on the surface thereof utilizing conventional deposition techniques such as chemical vapor deposition (CVD) or plasma-assisted CVD. Alternatively, pad oxide layer 12 may be formed on the substrate by utilizing a conventional thermal growing process. The thickness of pad oxide layer 12 is not critical to the present invention, but typically pad oxide layer 12 has thickness of from about 2 to about 10 nm.

The substrate employed in the present invention comprises any semiconducting material including, but not limited to: Si, Ge, SiGe, GaAs, InAs, InP and all other III/V semiconductor compounds, or substrate 10 may be composed of a layered substrate such as Si/SiGe or Si/SiO$_2$/Si (SOI). Of these semiconducting materials, it is preferred that Si be employed as the substrate.

FIG. 1 also includes a deep trench (DT) mask that is formed on the pad oxide layer utilizing conventional deposition processes well known in the art. The DT mask may comprise at least one dielectric material or, as is shown in FIG. 1, the DT mask may comprise various dielectric material layers. Specifically, the DT mask includes, a Si$_3$N$_4$ pad layer 14 formed on pad oxide layer 12 and a boron silicate glass (BSG) layer 16 that is formed over the Si$_3$N$_4$ pad layer. The dielectric layers may be deposited by the same or different deposition process and the dielectric layers may have the same or different thickness associated therewith. A layer of photoresist is formed over the BSG layer and then the photoresist is patterned utilizing conventional lithography to provide patterned photoresist 18.

As shown in FIG. 1, the patterned photoresist is then used to form opening 20 in DT mask as well as the pad oxide layer. Specifically, the opening is formed by reactive-ion etching (RIE) the various dielectric layers of the DT mask as well as the pad oxide layer, stopping on substrate 10. The etch chemistry used in this step of the present invention is highly selective for etching dielectric layers compared to silicon.

Figure 2:
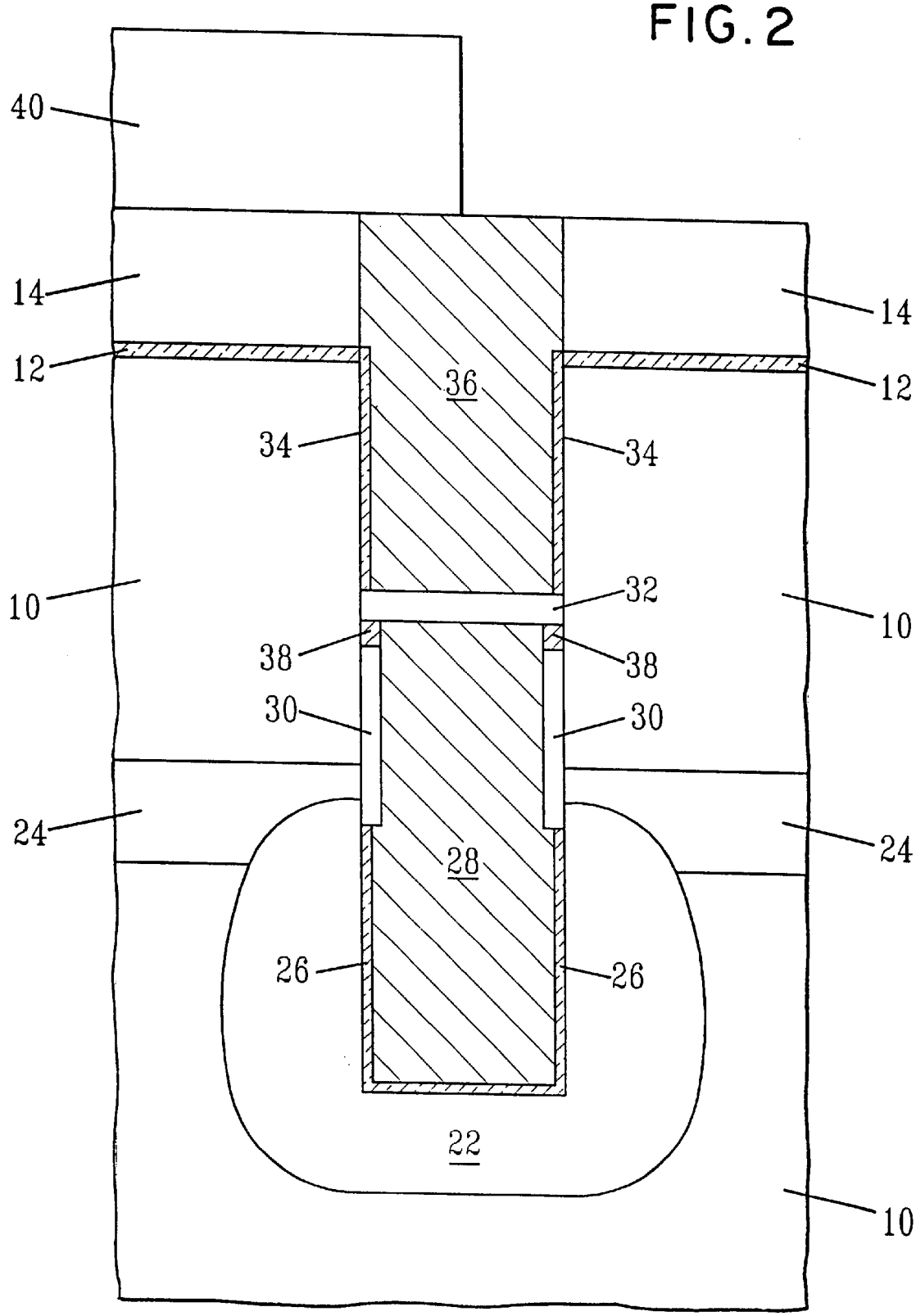

Next, as shown in FIG. 2, a storage trench that is substantially rectangular in design is etched into the substrate by RIE or another like etching process. It is noted that the storage trench is a deep trench which is capable of housing the storage capacitor in a bottom region thereof, and a vertical MOSFET in an upper region. A storage capacitor is formed in the bottom region of the trench utilizing techniques that are well known to those skilled in the art. The capacitor includes at least an N+ plate 22 formed about the exterior of the trench, a N band region 24 formed in the substrate abutting the DT, a storage node dielectric 26 lining the interior sidewalls of the bottom portion of the DT and N+ polysilicon 28 formed on said storage node dielectric. The N+ poly, i.e., N+ DT poly, is one of the electrodes of the capacitor.

After forming the storage capacitor in the bottom portion of the trench, a collar region 30 is formed above the capacitor so as to provide isolation between the capacitor and the MOSFET utilizing techniques well known in the art. It is also within the contemplation of the present invention to form the collar region prior to deposition of the N+ polysilicon in the storage trench. A vertical MOSFET is then formed in an upper region of the DT utilizing conventional vertical MOSFET process techniques that are also well known in the art. The vertical MOSFET includes a trench top oxide (TTO) dielectric 32 that is formed over a recess area provided in N+ polysilicon 28, a gate oxide (i.e., gate dielectric) 34 formed on interior sidewalls of the trench (the gate oxide may extend to meet the pad oxide layer) and an N+ polysilicon gate conductor (poly GC) 36. The structure shown in FIG. 2 also includes a polysilicon strap region 38 that is formed on the sidewalls of the DT between the collar regions and the TTO dielectric.

The structure shown in FIG. 2 is then planarized utilizing conventional planarization techniques such as chemical-mechanical polishing (CMP) to the top surface of Si$_3$N$_4$ pad layer 14. This planarization step thus removes BSG layer 16 from the structure. It is noted that the photoresist used in defining the opening was stripped prior to forming the capacitor in the trench.

FIG. 2 also includes a patterned photoresist 40 that is formed over the structure so that an edge of the photoresist lies midway across the short dimension of the deep trench opening exposing a portion of poly GC 36. Thus, in this step of the present invention some portions of the poly GC are protected by the photoresist, whereas other portions of the poly GC are left exposed. The patterned photoresist is formed by conventional deposition processes and lithography and etching are used in defining the pattern in the photoresist layer.

Figure 3:
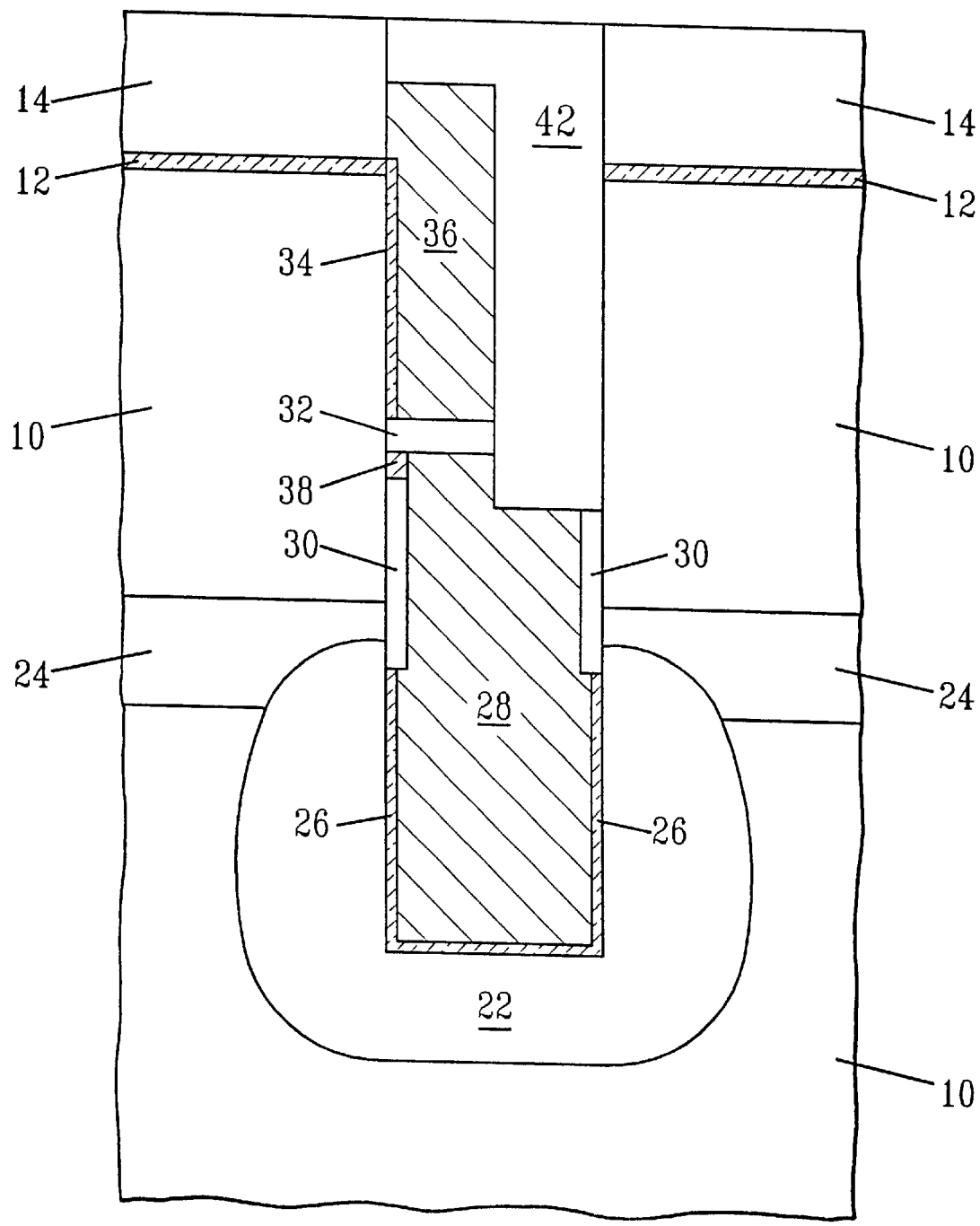

FIG. 3 shows the next steps of the present invention. Specifically, the exposed portion of the poly GC is then etched (e.g., RIE'd) selective to Si$_3$N$_4$, oxide and resist (utilizing standard GC plasma etch chemistry) stopping on the top surface of TTO dielectric 32. Patterned photoresist 40 is stripped utilizing conventional stripping processes and an oxide RIE is used to open exposed portions of TTO dielectric 32 to N+ DT poly 28, with reasonable selectivity to the Si$_3$N$_4$. The etch chemistry is then switched back to GC RIE and the exposed strap (on one side of the DT) as well as exposed portions of the N+ DT poly (the top surface is recessed beneath the top surface of the Si$_3$N$_4$ pad) are removed.

A layer of oxide 42 such as CVD oxide is then formed in the etched areas utilizing conventional deposition processes well known in the art. If needed, a planarization step is used to provide a planar structure stopping on the top surface of Si$_3$N$_4$ pad 14. Although any oxide may be used, it is highly preferred in the present invention to use a high density plasma (HDP) process in forming the oxide to facilitate filling the high aspect ratio of the gap between the poly GC and the sidewall of the substrate. It is noted that filling of this gap is not necessary since an interior void is allowable so long as the void is sealed at the top. Note that the process described above is adjusted such that the top surface of the poly GC is recessed to a depth which is half the thickness of the pad nitride.

To prevent unwanted formation of strap diffusion on the side of the trench which is adjacent to the oxide fill, a thin Si$_3$N$_4$ barrier layer (i.e., about 1 nm or less) may be formed prior to the deposition of the strap polysilicon. For simplicity, this barrier layer is not shown in the drawings of the present invention. The barrier nitride impedes the diffusion of dopant from the N+ DT poly into the substrate during gate oxidation. Later thermal processing breaks down this barrier layer, allowing the strap to outdiffuse on the desired side of the trench. Other options that may be employed in the present invention to impede unwanted strap out diffusion include, but are not limited to: low temperature gate oxidation and isotropic etching of a small amount of substrate on the trench sidewall.

Figure 4:
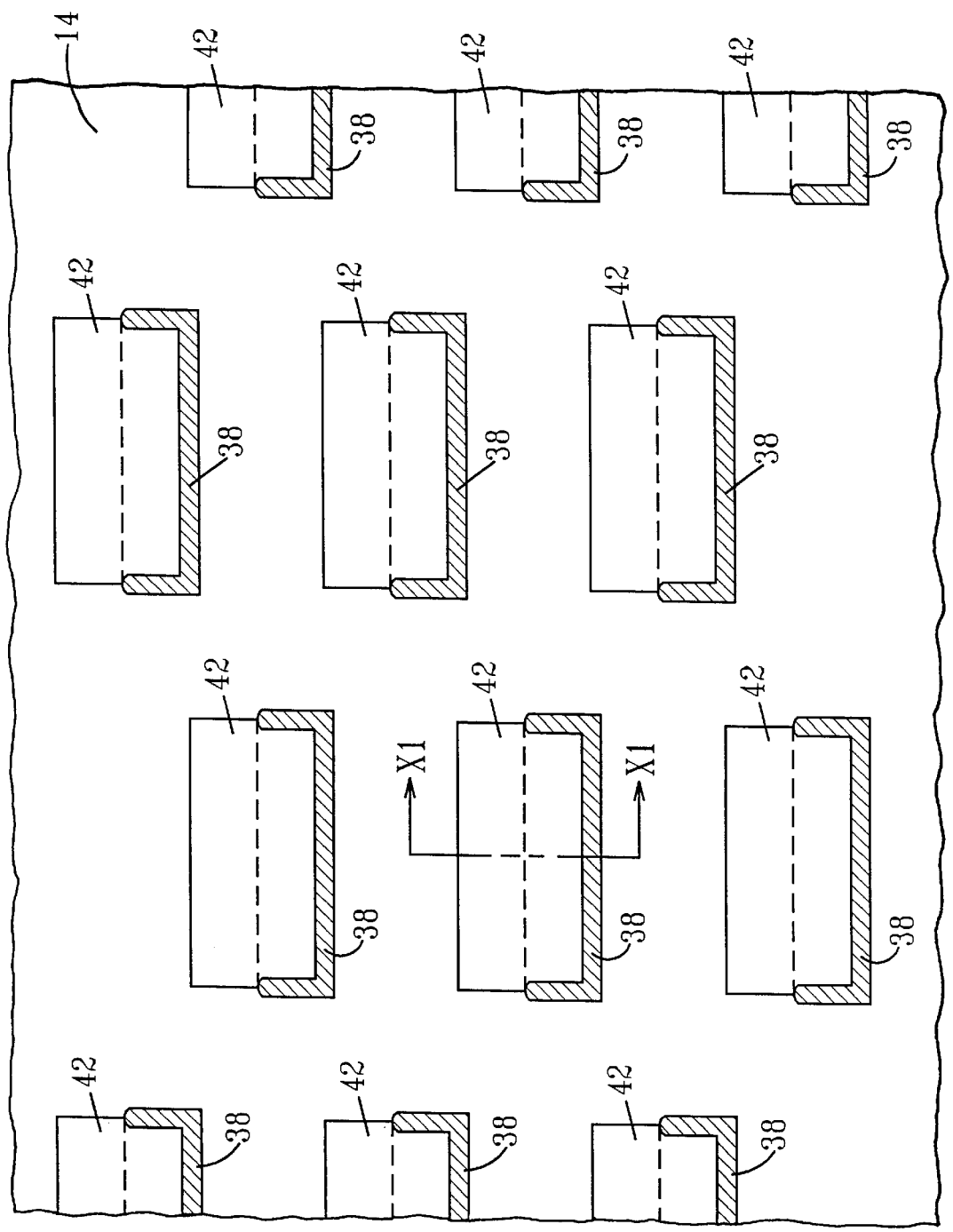

FIG. 4 shows a top view of a portion of the array at this point in the process. It is emphasized that poly GC 36 and strap 38 are removed from the upper side of the storage trench (as indicated by the horizontal line running across the width of the DT). The strap and poly GC, however, remain on the lower side of the trench.

Figure 5:
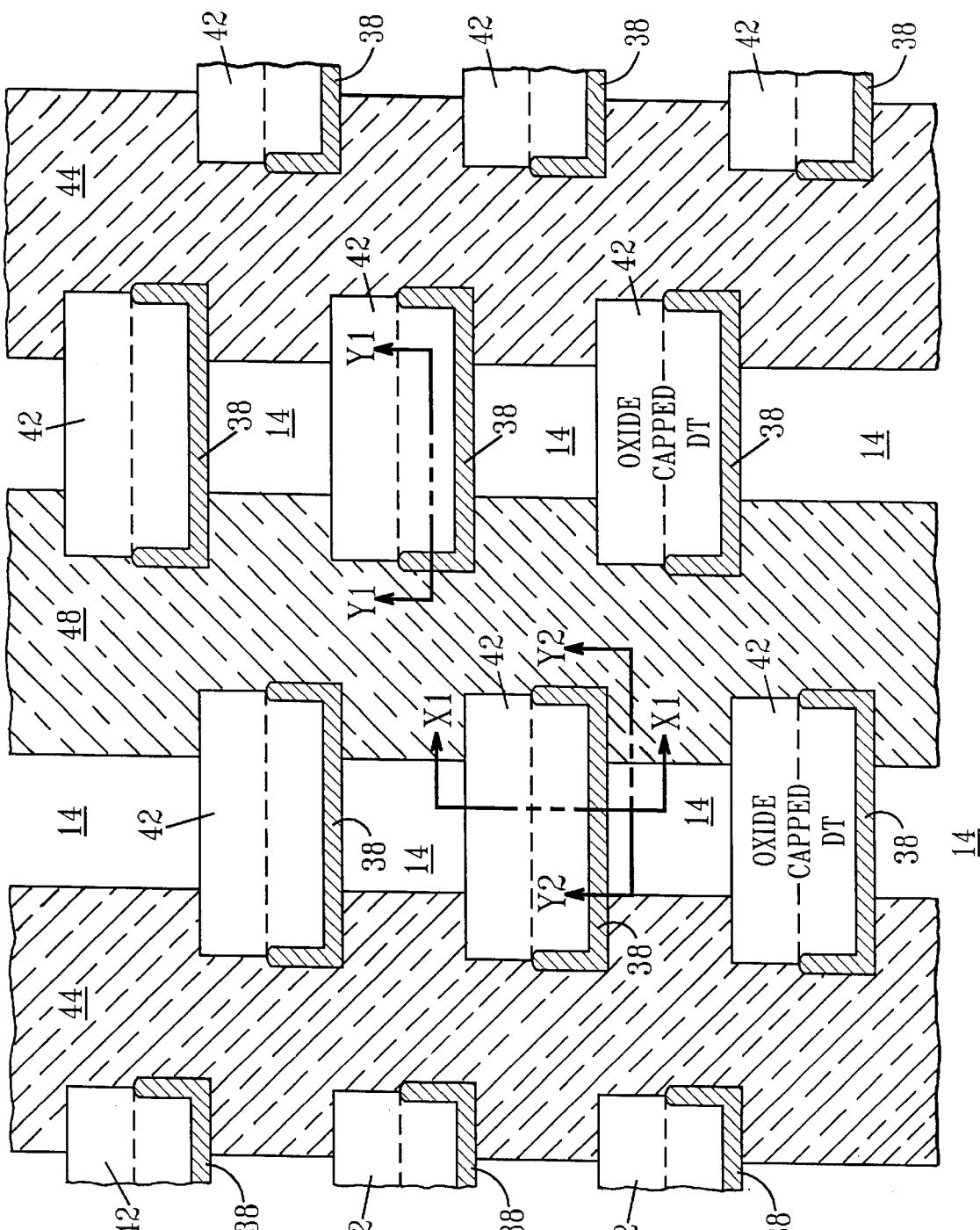

Next, troughs which will later become the wordline regions and the isolation regions (e.g., shallow trench isolation (STI) regions) are then formed in the substrate utilizing conventional techniques well known in the art. Specifically, an etch process that is selective to oxide is employed in forming the troughs. The troughs are then filled with a CVD oxide or other like dielectric material. In FIG. 5, the oxide filled wordline troughs are labeled as region 44 and isolation regions are labeled as 48.

Figure 6B:
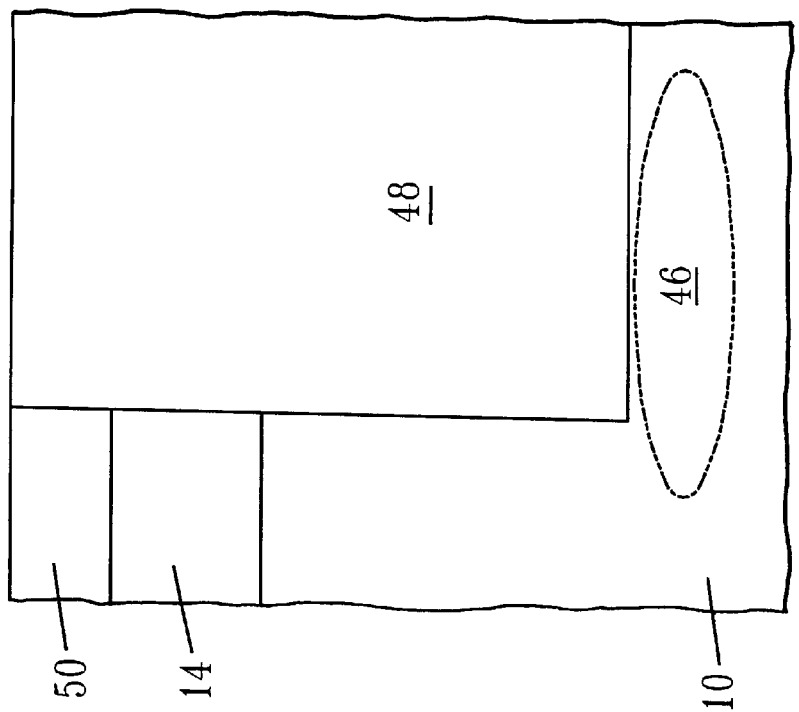
Figure 6A:
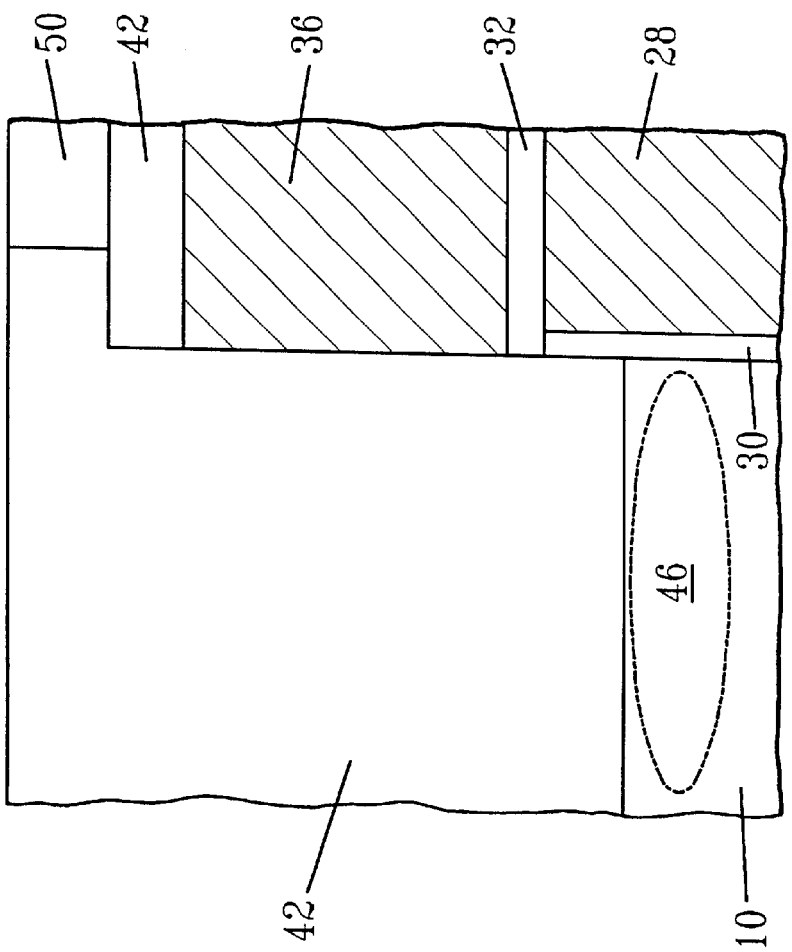

Prior to application of the photoresist which defines the troughs above, a second silicon nitride layer 50 is deposited on the planarized surface containing the oxide capped DTs and nitride pad, see FIGS. 6A–B. A photoresist is thereafter applied, exposed and developed and the trough pattern is RIE'd into the underlying nitride layers stopping on the oxide cap and substrate. The substrate is then removed by utilizing a standard RIE process that is capable of anisotropically etching silicon or any other like semiconductor material. The etch continues to a depth which is below the bottom of the strap out diffusion to be subsequently formed. Since the etching employed is selective to silicon compared to oxide, the troughs jog around the storage trenches.

Standard AA oxidation may be carried out at this point of the process, followed by a shallow field implant into the bottom of the trough. The shallow implant forms a field doping region 46 beneath the trough. The trough is then filled with a CVD oxide or another like trench dielectric material and planarized to the top surface of the upper nitride layer. This forms trench isolation regions 48 as well as placeholder regions for damascened wordlines in the substrate. Support area trench isolation is also formed by this step. It is emphasized herein that the width of the trench isolation stripes is 2F, which halves the aspect ratio to be filled compared to standard trench isolation methods. This relaxed aspect ratio greatly simplifies the process of filling the STI.

Figure 7:
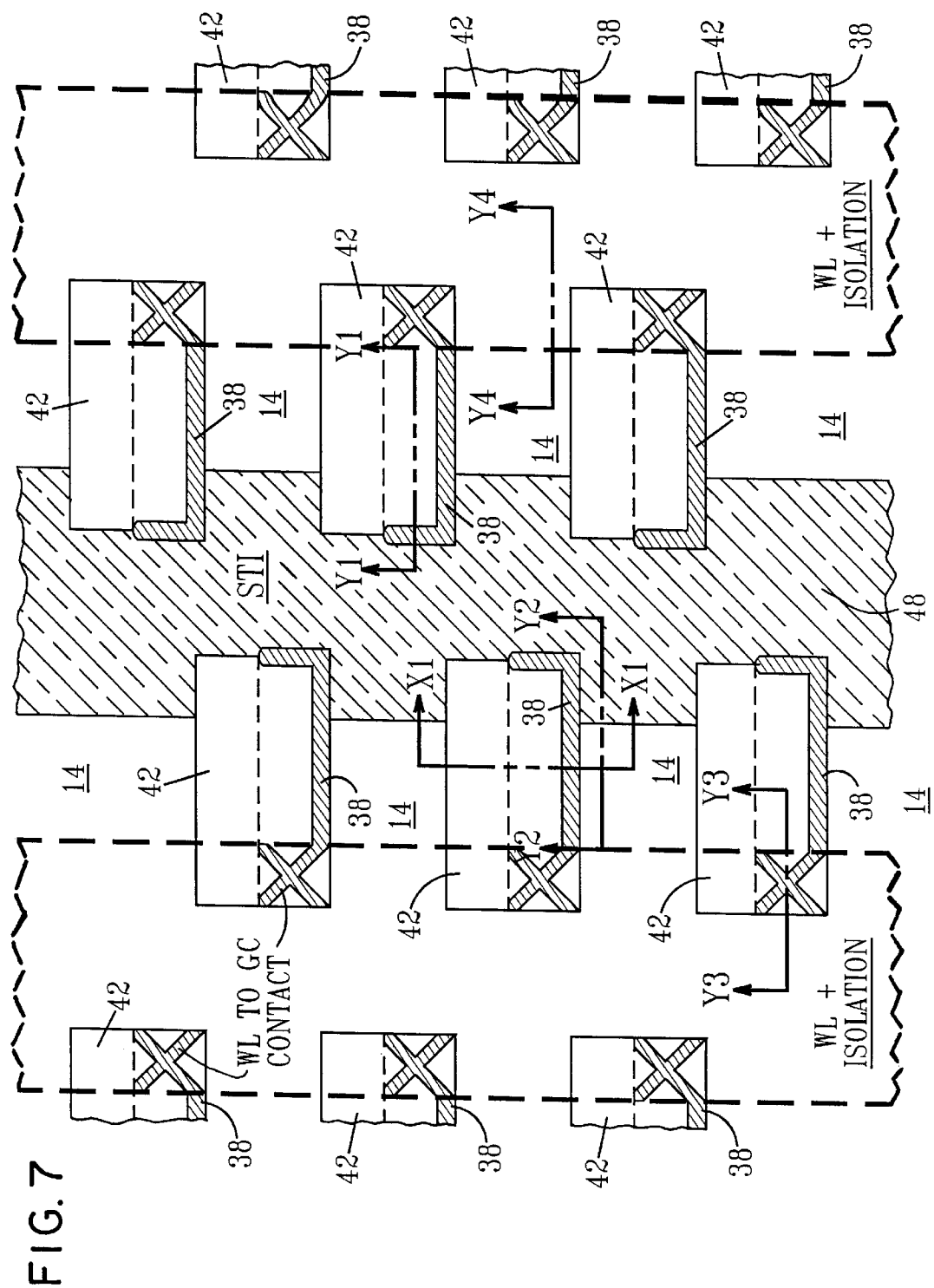

The next step of the present invention, which is shown in FIG. 7 (top view), is the formation of integrated wordline/isolation regions. Specifically, FIG. 7 is a top view showing the location of wordlines with respect to the DT's and isolation regions. The wordline troughs 44 etched into the substrate serve a dual purpose: (1) provide a region for the wordline conductors (damascened), and (2) provide isolation between adjacent columns of cells. It is noted that the width of each wordline trough is about 2F. Each wordline trough overlaps adjacent DT by about 0.5F, assuring sufficient area for the wordline to GC contacts, and also assuring that no leakage path exists around the perimeter of the DT's. As stated above, the troughs (wordline (WL) troughs and trench isolation regions) "jog" around the perimeter of the storage trench.

Figure 8B:
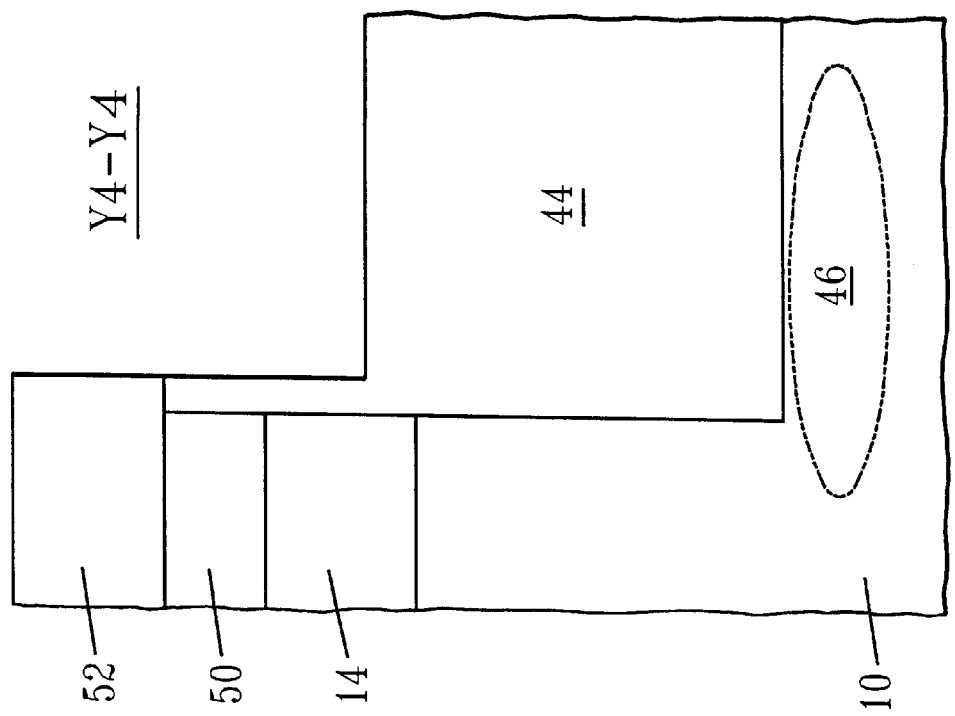
Figure 8A:
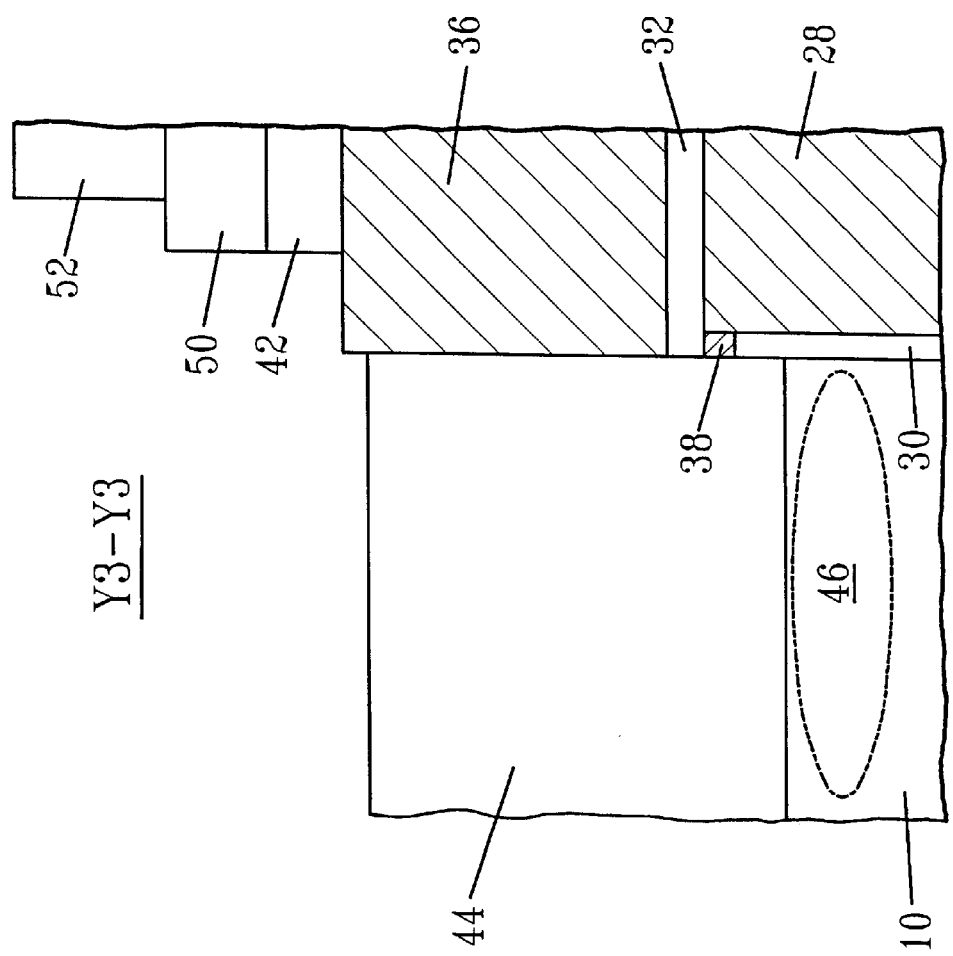
Figure 9B:
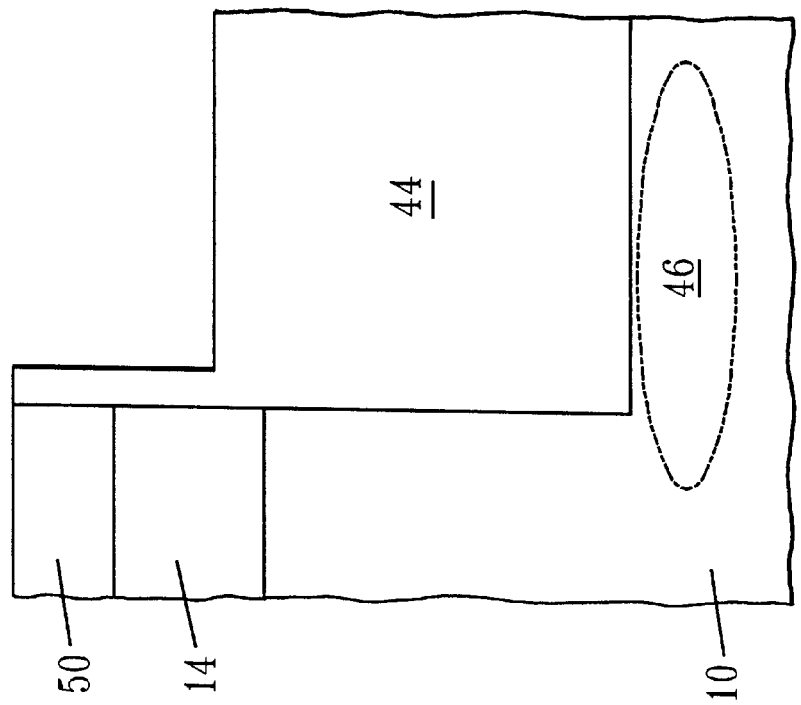
Figure 9A:
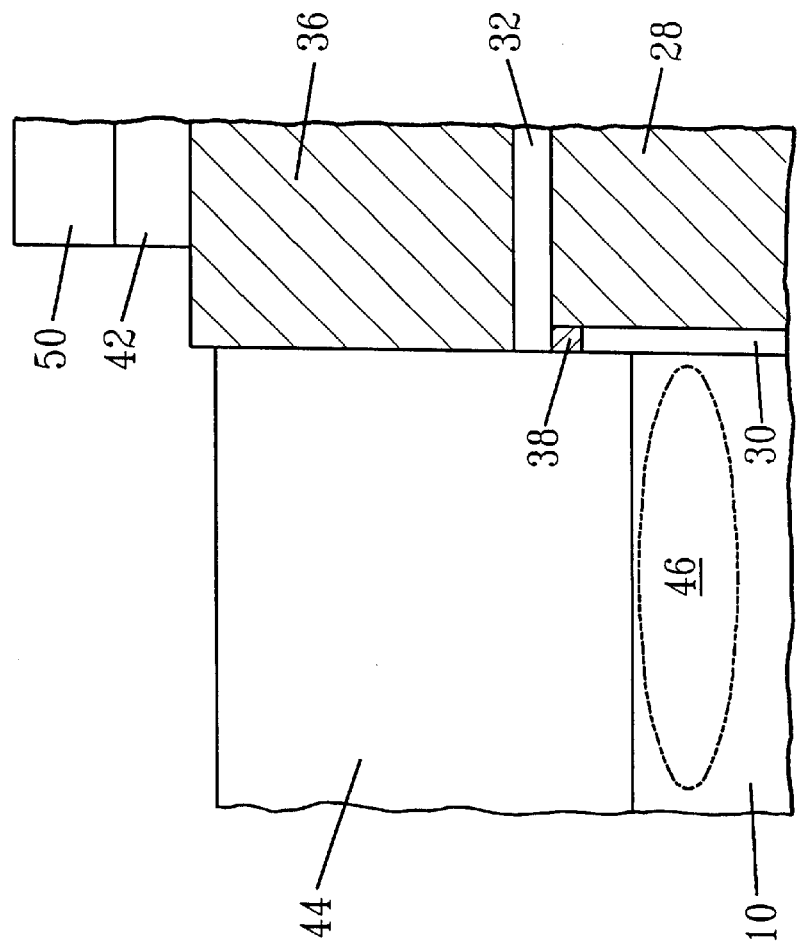
Figure 13B:
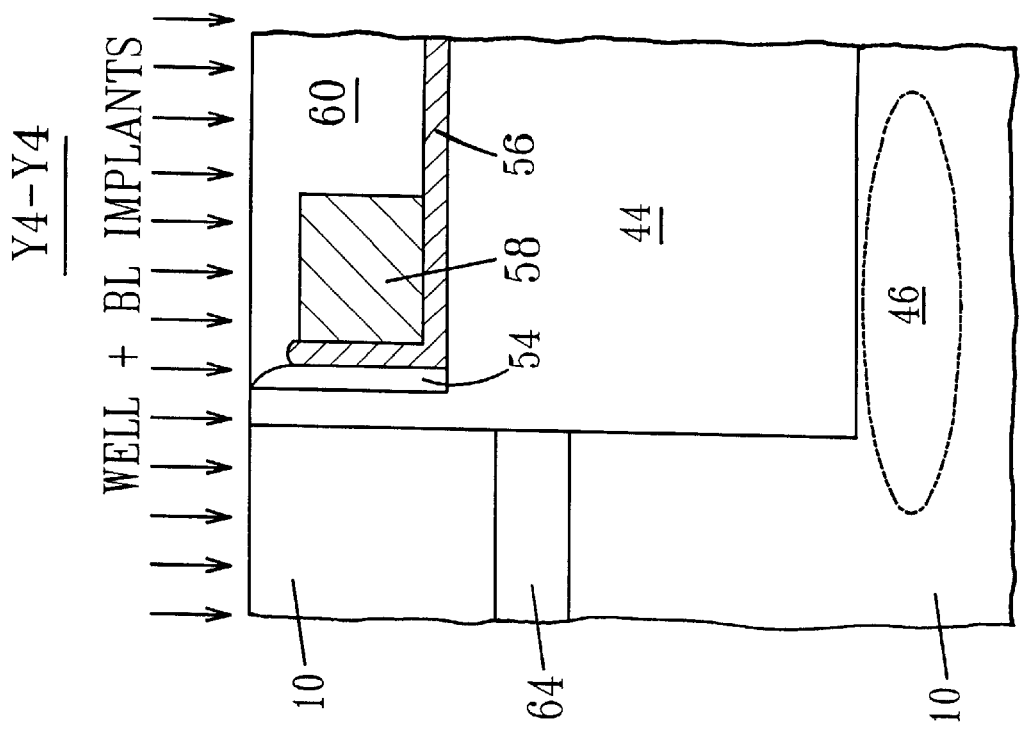
Figure 13A:
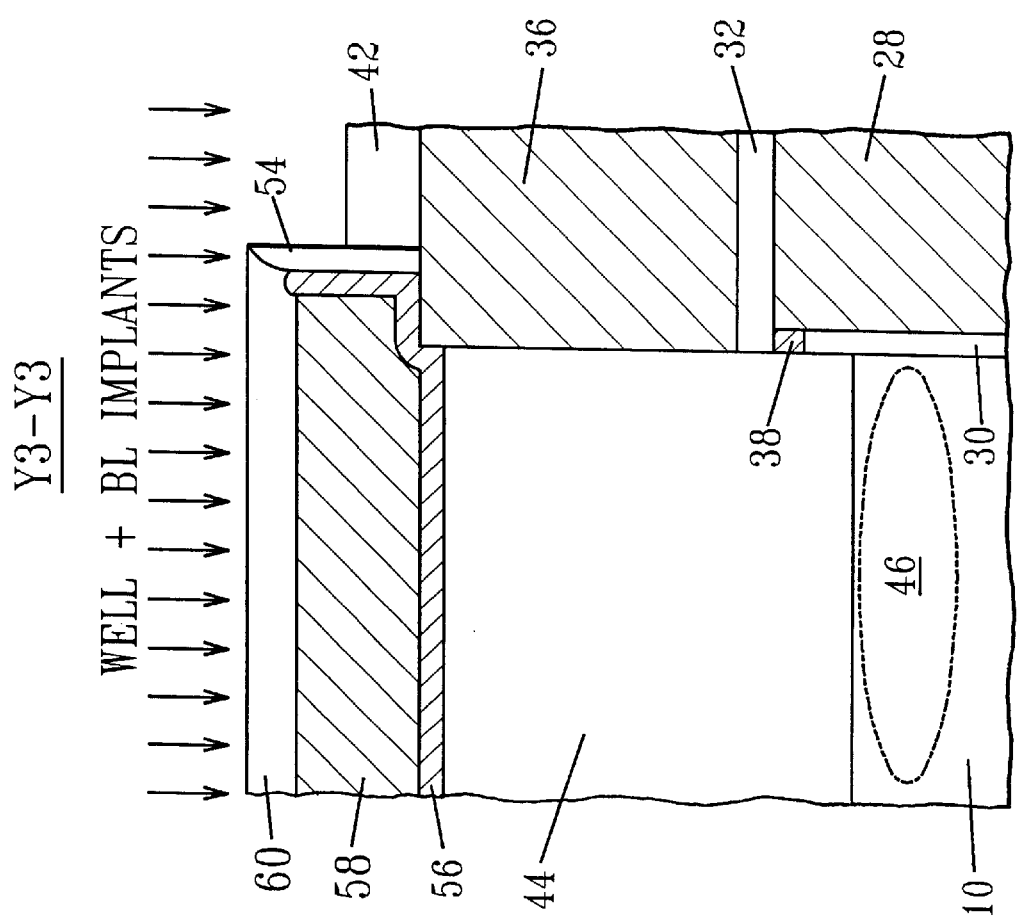

Next, as shown in FIGS. 8A–B, a block of photoresist 52 is patterned in a photoresist layer which defines regions to be protected from subsequent recessing of the oxide fill in the wordline troughs. It is noted that the photoresist edge is intentionally shown misaligned with respect to the edge of the $Si_3N_4$ layer to illustrate the robustness of the process. The exposed oxide in the wordline troughs is then recessed (using RIE selective to nitride) to slightly below the surface of the N+ poly GC, but not below the bottom of the lower nitride pad layer. The photoresist layer also protects the support regions from etching the isolation regions during this step. Resist 52 is then removed utilizing conventional stripping processes well known in the art, See, FIGS. 9A–9B.

FIG. 10 shows the next steps of the present invention. Oxide spacers 54 are then formed on exposed sidewalls utilizing conventional techniques well known in the art. A layer of WN or other suitable conductive diffusion barrier 56 is next deposited utilizing conventional deposition processes. The diffusion barrier prevents diffusion of dopant from the N+ poly GC into the overlying wordline conductor, which will be subsequently formed.

A layer of highly conductive material 58, such as W or silicide, is deposited, planarized to the top surface of the nitride and recessed. The planarization/recess operation removes the exposed portion of the diffusion barrier layer, such that the barrier layer remains under the wordline conductor interface. A layer of CVD oxide 60 is then deposited and planarized. These processes steps of the present invention are shown in FIGS. 11A–B.

FIGS. 12A–B and 13A–B show various cross-sections of the structure during well and bitline diffusion 64. Specifically, prior to forming the well and bitline implants, the nitride layers are stripped selective to oxide and substrate. The pad nitride in the support regions is also removed by this operation. A sacrificial oxide (not shown) is then grown on the exposed substrate and is used as an implant mask. Then the array P-wells 66, bitline diffusions 64 and the support CMOS wells are formed using conventional implantation steps that are well known to those skilled in the art. Since the various implantation steps are well known in the art, a detailed description regarding these implant steps is not needed herein.

The support areas of the structure are then processed using the following techniques: First, the above sacrificial oxide is removed utilizing processing techniques well known in the art. A gate oxide is grown on the surface of the substrate and a gate conductor stack is deposited for the support MOSFETS. The gate conductor stack is patterned to form the gates of the support MOSFET. This support gate is also used. The support gate mask is also used to completely remove the support gate conductor stack from the array area.

Figure 14:
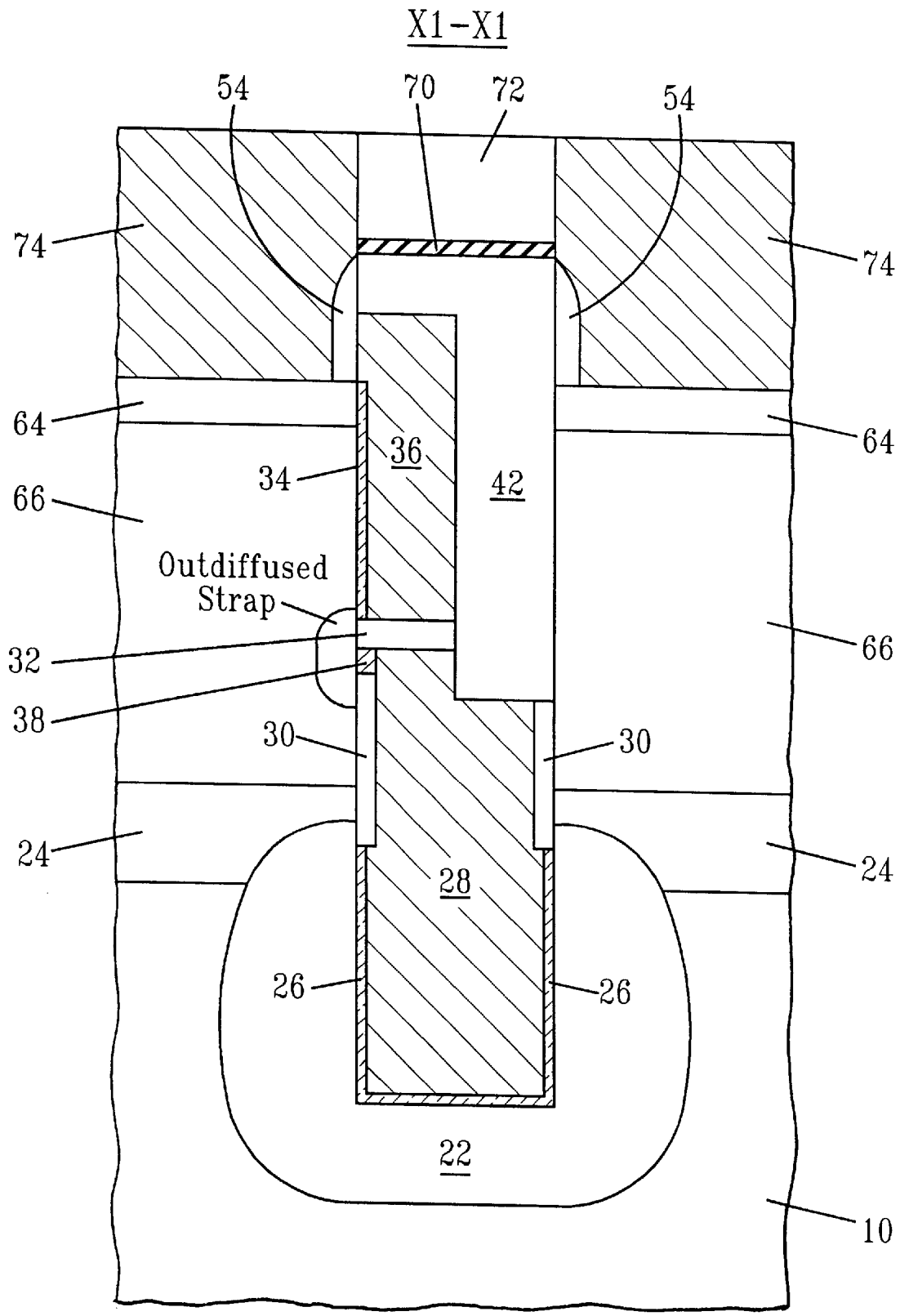
Figure 15B:
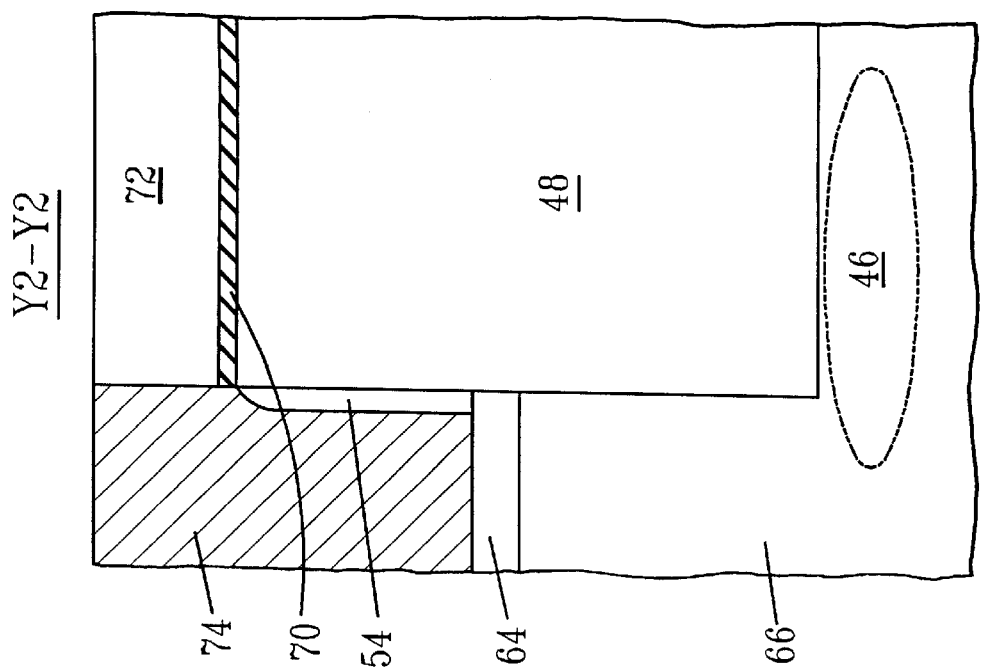
Figure 15A:
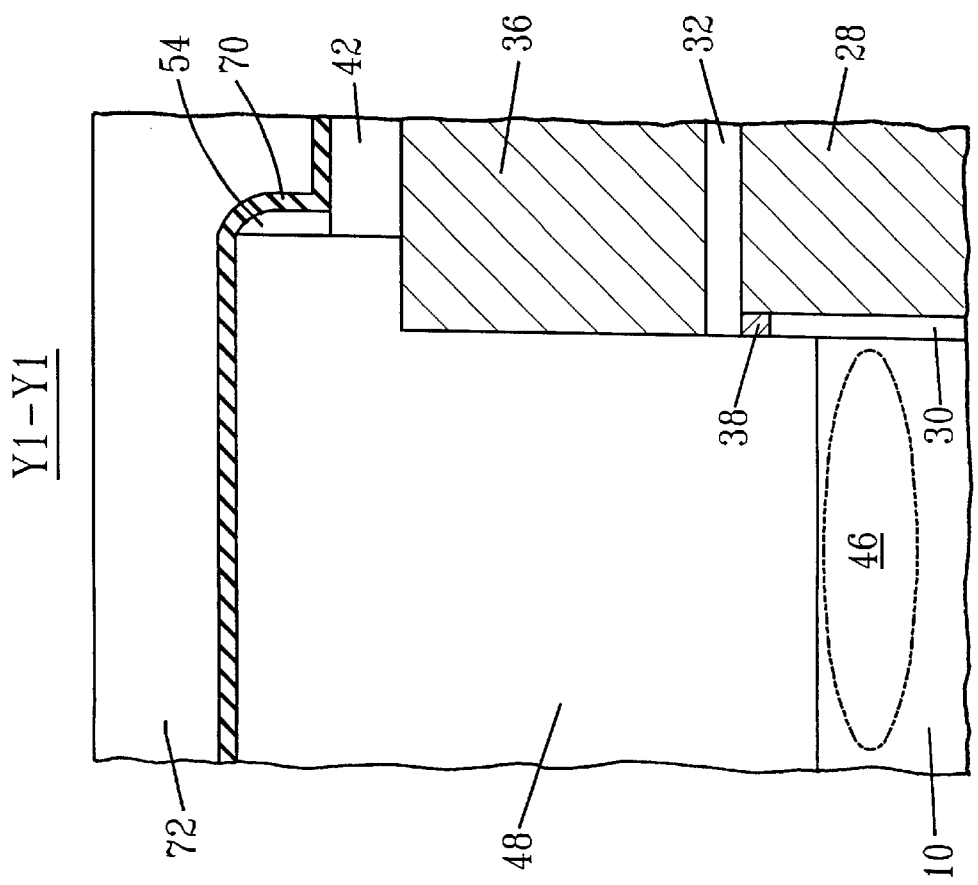
Figure 16B:
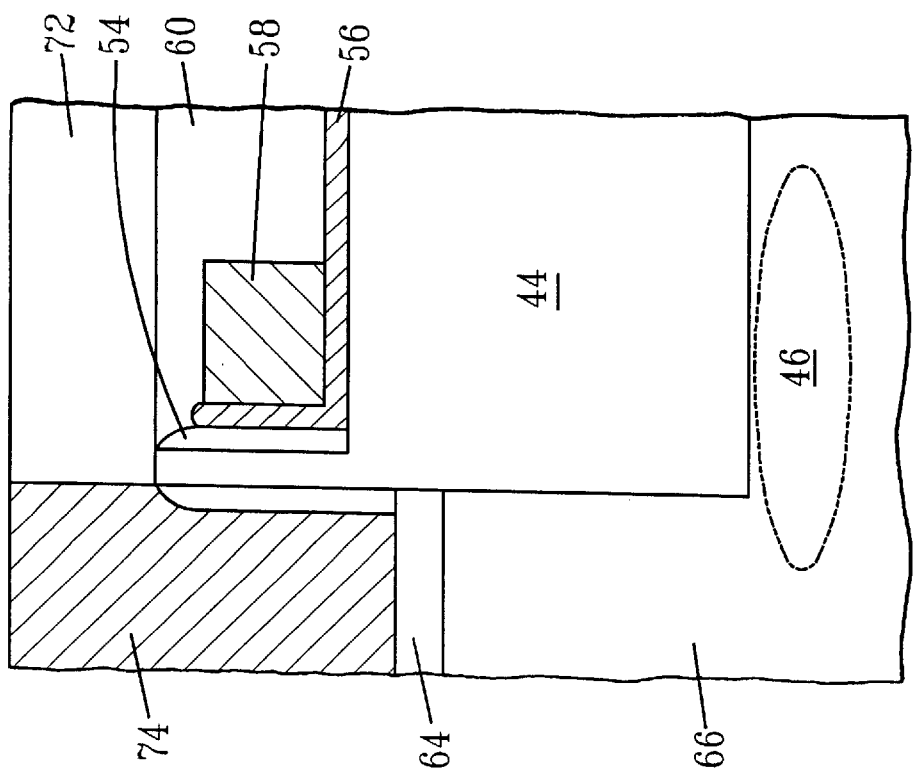
Figure 16A:
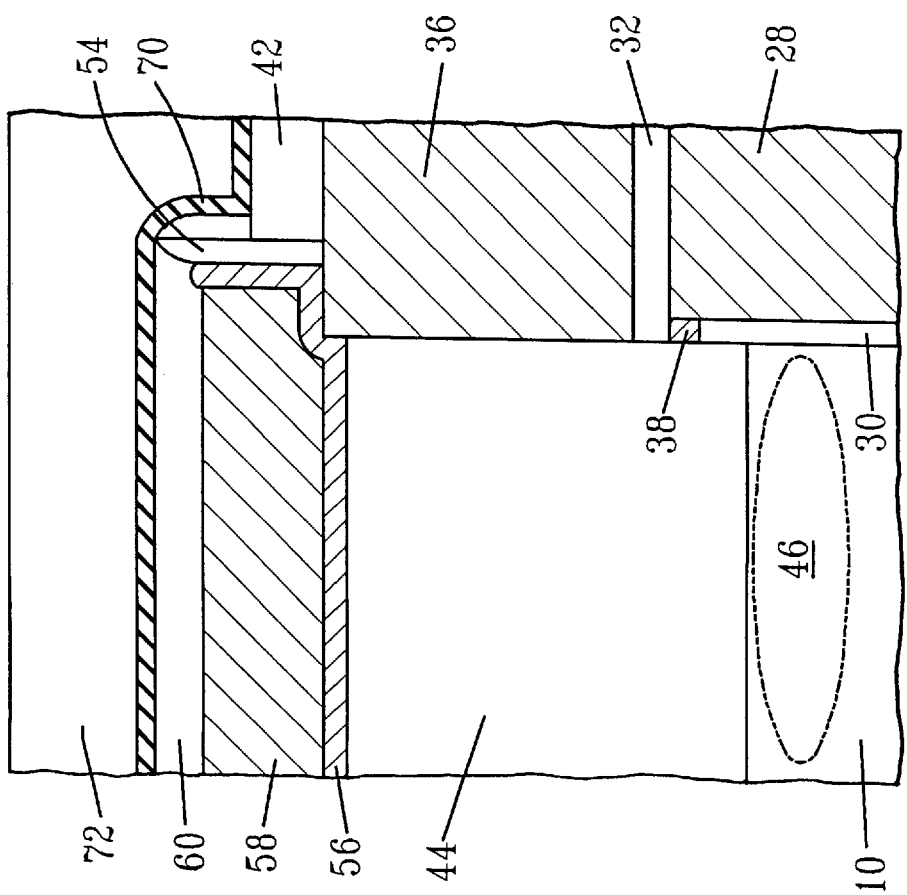

Reference is next made to FIG. 14 in which a thin nitride layer 70 having a thickness of from about 4 to about 15 nm is formed on the oxide capped DT utilizing conventional deposition processes well known to those skilled in the art. A layer of boron doped phosphorus silicate glass, BPSG, 72 is deposited over the nitride layer and then the structure is planarized. Contact stud vias are then RIE'd in the BPSG stopping on the thin nitride layer. The exposed portion of the thin nitride layer is then removed utilizing removal processes well known in the art. Contact doping is implanted into the open vias and a stud conductive material 74 such as W or polysilicon is deposited and planarized. Since the vertical MOSFET is tolerant of a relatively deep bitline diffusion, W studs may be used in the array, as well as the supports. This simplifies the process for the formation of contacts.

FIGS. 15A–B and 16A–B are various s cross-sections illustrating the structure at this point in the process, i.e., after formation of diffusion contact studs. Conventional processing follows, which includes deposition of additional inter-level dielectric layers, formation of bitline conductors, and formation of upper wiring conductors and vias.

Figure 17:
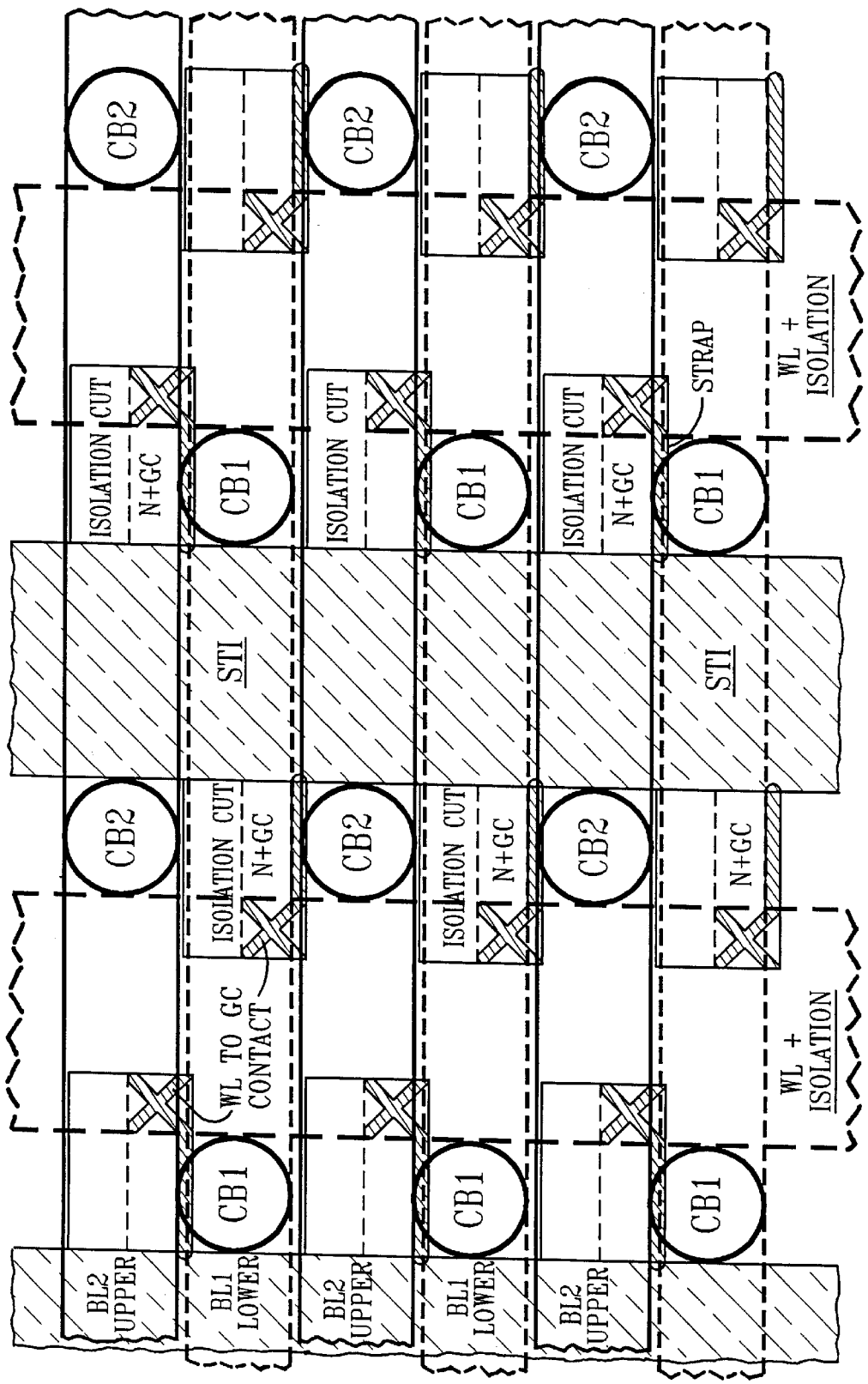

FIG. 17 represents a top vIew of a portion of the array showing the structure features on the diffusion contact studs. Note the locations of the DT storage capacitor, gate conductors (GC), wordlines and area of contact to GC, trench isolation and bitline contact stud regions for both lower CB1 and upper CB2 bitlines. Note that the two levels (lower and upper) of bitlines is employed in the present cell design. This allows a bitline pitch which is less than 2F.

Figure 18:
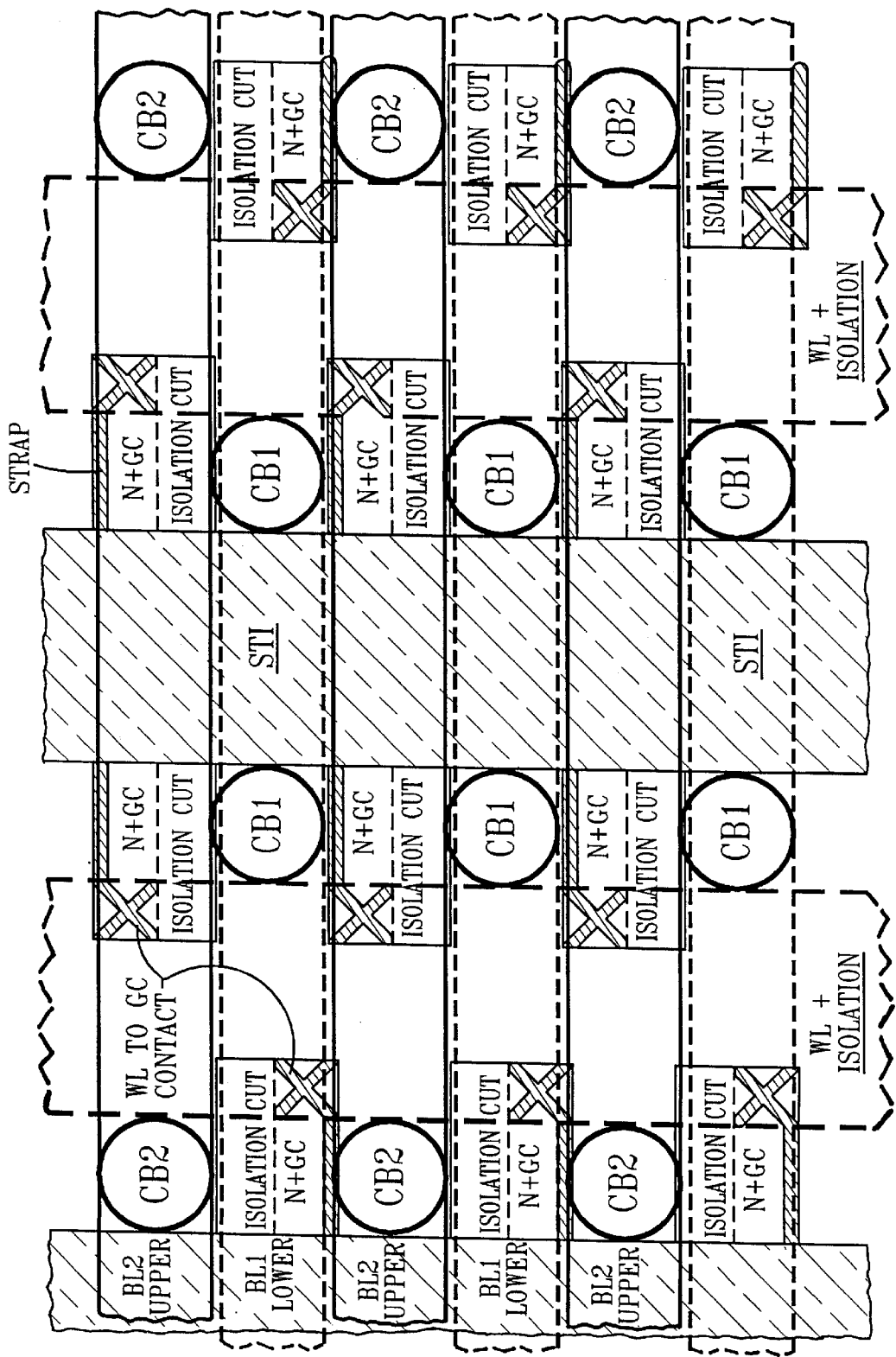
FIG. 18 depicts a preferred layout for the $6F^2$ memory cell of the present invention.

A preferred embodiment of the present invention is shown in FIG. 18. The preferred layout illustrated in FIG. 18 significantly simplifies the application of the gate/strap cut mask compared to the layout in FIG. 17. Note the columns of storage trenches adjacent to each isolation trench region are now arranged such that the trench, gate conductor regions and isolation cut regions are in alignment across each trench isolation region. Furthermore, for all cells in FIG. 17, contacts to the poly GC and strap are formed on the south side of each storage trench. In FIG. 18, the staggering of the side of the trench used for GC and straps allows the use of a single cut mask of minimum pitch; each line of the cut mask extends midway across two adjacent bitlines.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the spirit and scope of the appended claims.

Having thus described our invention in detail, what we claim as new, and desire to secure by the Letters Patent is:

1. A $6F^2$ memory cell structure comprising:
   a plurality of capacitors each located in a separate trench in a substrate;
   a plurality of transfer transistors each having a vertical gate dielectric, a gate conductor, and a bitline diffusion, each transistor being located above and electrically connected to a respective trench capacitor;
   a plurality of isolation troughs in a striped pattern about said transistors, said troughs being spaced apart by a substantially uniform spacing, said plurality of striped troughs comprising a first group of troughs consisting of every other one of said troughs being filled with a dielectric material, and a second group of troughs being the remaining troughs of said plurality, said second group of troughs containing dielectric material, damascened wordlines and damascene wordline contacts;
   a respective wordline electrical contact connected to each respective gate conductor; and
   a bitline contacted to each bitline diffusion, wherein said bitline diffusion has a width defined by said spacing of said striped troughs and each wordline electrical contact is self-aligned to an edge of a trough of said second group of troughs.

2. The $6F^2$ memory cell of claim 1 wherein said substrate is composed of Si, Ge, SiGe, GaAs, InAs, InP, Si/SiGe or $Si/SiO_2/Si$.

3. The $6F^2$ memory cell of claim 2 wherein said substrate is composed of Si.

4. The $6F^2$ memory cell of claim 1 wherein each of said capacitors includes at least a plate electrode about an exterior region of said trench, a storage node dielectric layer lining said trench, and an inner electrode composed of N+ polysilicon.

5. The $6F^2$ memory cell of claim 1 wherein said capacitors and said transfer transistors are separated in said trench by a collar isolation region.

6. The $6F^2$ memory cell of claim 5 wherein a diffusion strap is located on one sidewall of the trench above said collar isolation region.

7. The $6F^2$ memory cell of claim 1 wherein said substrate further includes an N-band region abutting a lower region of said trench wherein said capacitor is located.

8. The $6F^2$ memory cell of claim 7 wherein a P-well is formed above said N-band region.

9. The $6F^2$ memory cell of claim 1 wherein a field doping region is formed beneath each trough that is filled with a dielectric material.

10. The $6F^2$ memory cell of claim 1 wherein said damascened wordline comprises at least a wordline conductor, an oxide layer formed on a top surface of said wordline conductor and spacers formed on sidewalls of said conductor and said oxide.

11. The $6F^2$ memory cell of claim 1 wherein said damascened wordline further comprises a diffusion barrier layer beneath said wordline conductor.

12. The $6F^2$ memory cell of claim 1 wherein said bitline contact is composed of W or polysilicon.

13. The $6F^2$ memory cell of claim 1 wherein said bitline contact is a W stud.

14. The $6F^2$ memory cell of claim 1 wherein said bitline diffusion is an N+ layer that is formed in the surface of the substrate.

15. The $6F^2$ memory cell of claim 1 wherein said trenches containing said capacitors and said transistors are 2F deep and 1F wide and said first group of troughs is 2F.

16. The $6F^2$ memory cell of claim 1 wherein each of trenches including said capacitors and said transistors, gate conductor, and isolation cut regions are in alignment across each trench isolation region.

17. The $6F^2$ memory cell of claim 1 wherein said $6F^2$ has a minimum feature size of 100 nm or below.

18. The $6F^2$ memory cell of claim 1 wherein said trenches including said capacitors and said transistors are substantially rectangular in design.

19. The $6F^2$ memory cell of claim 1 said damascened wordline and said trench isolation regions are formed around a perimeter of said storage trenches.

* * * * *

UNITED STATES PATENT AND TRADEMARK OFFICE
CERTIFICATE OF CORRECTION

PATENT NO. : 6,288,422 B1  
DATED : September 11, 2001  
INVENTOR(S) : Jack A. Mandelman et al.

Page 1 of 1

It is certified that error appears in the above-identified patent and that said Letters Patent is hereby corrected as shown below:

Column 6,  
Line 60, "vIew" should read -- view --

Column 8,  
Line 54, "various s cross-sections" should read -- various cross-sections --

Column 9,  
Line 33, "isolation troughs" should read -- troughs --

Signed and Sealed this

Twenty-eighth Day of May, 2002

Attest:

Attesting Officer

JAMES E. ROGAN  
Director of the United States Patent and Trademark Office